（12）United States Patent
Chang et al.

(10) Patent No.: US 8,477,539 B2
(45) Date of Patent: **\*Jul. 2, 2013**

(54) NON-VOLATILE MEMORY CELL AND METHODS FOR PROGRAMMING, ERASING AND READING THEREOF

(75) Inventors: Chia-Chuan Chang, Miaoli County (TW); Wei-Sung Chen, Hsinchu County (TW); Chung-Ho Wu, Hsinchu (TW)

(73) Assignee: Vangaurd International Semiconductor Corporation, Hsinchu (TW)

( \* ) Notice: Subject to any disclaimer, the term of this patent is extended or adjusted under 35 U.S.C. 154(b) by 124 days.

This patent is subject to a terminal disclaimer.

(21) Appl. No.: 13/183,937

(22) Filed: Jul. 15, 2011

(65) Prior Publication Data

US 2013/0016567 A1 Jan. 17, 2013

(51) Int. Cl.
*G11C 16/04* (2006.01)

(52) U.S. Cl.
USPC ............ 365/185.26; 365/185.05; 365/185.18; 365/185.27

(58) Field of Classification Search
USPC .............. 365/185.26, 185.18, 185.05, 185.27
See application file for complete search history.

(56) References Cited

U.S. PATENT DOCUMENTS

| | | | | |
|---|---|---|---|---|
| 6,512,700 | B1 * | 1/2003 | McPartland et al. | 365/185.28 |
| 7,411,828 | B2 * | 8/2008 | Diorio et al. | 365/185.18 |
| 7,573,749 | B2 * | 8/2009 | Diorio et al. | 365/185.21 |
| 7,700,993 | B2 * | 4/2010 | Cai et al. | 257/315 |
| 2007/0194371 | A1 * | 8/2007 | Benjamin | 257/320 |
| 2008/0035973 | A1 * | 2/2008 | Lin et al. | 257/298 |

\* cited by examiner

*Primary Examiner* — Pho M Luu
(74) *Attorney, Agent, or Firm* — Birch, Stewart, Kolasch & Birch, LLP

(57) ABSTRACT

A non-volatile memory cell and methods for programming, erasing and reading thereof are provided. A non-volatile memory cell includes a substrate having a first conductive type. A first transistor, a second transistor and a select transistor having a second conductive type are disposed in the substrate, wherein a first gate of the first transistor is coupled to a second gate of the second transistor. A source region of the first transistor is coupled to a bit line. A drain region of the second transistor and a gate of the select transistor are coupled to a select gate line. A drain region of the first transistor is coupled to a source region of the select transistor. A drain region of the select transistor is coupled to a select line.

22 Claims, 6 Drawing Sheets

NON-VOLATILE MEMORY CELL AND METHODS FOR PROGRAMMING, ERASING AND READING THEREOF

BACKGROUND OF THE INVENTION

1. Field of the Invention

The present invention relates to a non-volatile memory cell and methods for programming, erasing and reading thereof, and in particular, to a single gate electrically erasable programmable read-only memory (EEPROM) cell and methods for programming, erasing and reading thereof.

2. Description of the Related Art

The conventional single gate non-volatile memory cell is usually composed by a select transistor and a store transistor, which are coupled in series. Because data of the non-volatile memory cell is stored in a single store transistor, the operation efficiency (including programming speed and erasing speed) of the cell can not be improved. Additionally, the conventional single gate non-volatile memory cell has a small read current, resulting in a narrow margin of read currents occurring between a program state and an erase state of the cell. If the conventional single gate non-volatile memory cell is subjected to a finite number of programming/erasing operation cycles, a difference of the read currents in the program state and the erase state will be hard to distinguish. The reliability of the non-volatile memory cell will suffered from the aforementioned drawbacks.

Thus, a novel non-volatile memory cell and methods for programming, erasing and reading thereof are desired.

BRIEF SUMMARY OF INVENTION

A non-volatile memory cell and methods for programming, erasing and reading thereof are provided. An exemplary embodiment of a non-volatile memory cell, which is used to store a single bit data, comprises a substrate having a first conductive type. A first store transistor, and a second store transistor having a second conductive type opposite to the first conductive type, are disposed in the substrate, wherein a first gate of the first transistor and a second gate of the second transistor are coupled to each other. A select transistor having a second conductive type is disposed in the substrate. A first source region of the first transistor is coupled to a bit line. A second drain region of the second transistor and a select gate of the select transistor are coupled to a select gate line. A first drain region of the first transistor is coupled to a source region of the select transistor. A third drain region of the select transistor is coupled to a select line, so that a bit is stored in the first and second gates by controlling the bit line and the select gate line, or the bit stored in the first and second gates is erased by controlling the bit line and the select gate line.

One exemplary embodiment of a method for programming a non-volatile memory cell, which is used to store a single bit data, comprises providing a non-volatile memory cell comprising a substrate having a first conductive type. A first store transistor, and a second store transistor having a second conductive type opposite to the first conductive type, are disposed in the substrate, wherein a first gate of the first transistor and a second gate of the second transistor are coupled to each other. A select transistor having a second conductive type is disposed in the substrate. A first source region of the first transistor is coupled to a bit line. A second drain region of the second transistor and a select gate of the select transistor are coupled to a select gate line. A first drain region of the first transistor is coupled to a source region of the select transistor. A third drain region of the select transistor is coupled to a select line, so that a bit is stored in the first and second gates by controlling the bit line and the select gate line, or the bit stored in the first and second gates is erased by controlling the bit line and the select gate line. A second source region of the second store transistor is electrically floating. Alternatively, the non-volatile memory cell further comprises a second well having the second conductive type disposed in the first well, wherein the second store transistor is disposed on the first well. A first voltage is applied to the bit line. A second voltage is applied to the select gate line. A third voltage is applied to the select line and the well region, wherein the first voltage is smaller than or equal to the second voltage, and the third voltage is 0V.

Another exemplary embodiment of a method for programming a non-volatile memory cell, which is used to store a single bit data, comprises providing a non-volatile memory cell comprising a substrate having a first conductive type. A first store transistor, and a second store transistor having a second conductive type opposite to the first conductive type, are disposed in the substrate, wherein a first gate of the first transistor and a second gate of the second transistor are coupled to each other. A select transistor having a second conductive type is disposed in the substrate. A first source region of the first transistor is coupled to a bit line. A second drain region of the second transistor and a select gate of the select transistor are coupled to a select gate line. A first drain region of the first transistor is coupled to a source region of the select transistor. A third drain region of the select transistor is coupled to a select line, so that a bit is stored in the first and second gates by controlling the bit line and the select gate line, or the bit stored in the first and second gates is erased by controlling the bit line and the select gate line. A second source region of the second store transistor is coupled to the bit line. Alternatively, the non-volatile memory cell further comprises a second well having the second conductive type disposed in the first well, wherein the second store transistor is disposed on the first well. A first voltage is applied to the bit line. A second voltage is applied to the select gate line, the select line and the substrate, wherein the first voltage is larger than 0V and the second voltage is 0V.

One exemplary embodiment of a method for erasing a non-volatile memory cell, which is used to store a single bit data, comprises providing a non-volatile memory cell comprising a substrate having a first conductive type. A first store transistor, and a second store transistor having a second conductive type opposite to the first conductive type, are disposed in the substrate, wherein a first gate of the first transistor and a second gate of the second transistor are coupled to each other. A select transistor having a second conductive type is disposed in the substrate. A first source region of the first transistor is coupled to a bit line. A second drain region of the second transistor and a select gate of the select transistor are coupled to a select gate line. A first drain region of the first transistor is coupled to a source region of the select transistor. A third drain region of the select transistor is coupled to a select line, so that a bit is stored in the first and second gates by controlling the bit line and the select gate line, or the bit stored in the first and second gates is erased by controlling the bit line and the select gate line. A second source region of the second store transistor is electrically floating. Alternatively, the non-volatile memory cell further comprises a second well having the second conductive type disposed in the first well, wherein the second store transistor is disposed on the first well. A first voltage is applied to the bit line. A second voltage is applied to the select gate line. A third voltage is applied to the select line and the well region, wherein the first voltage is larger than the second voltage and the third voltage is 0V.

Another exemplary embodiment of a method for erasing a non-volatile memory cell, which is used to store a single bit data, comprises providing a non-volatile memory cell comprising a substrate having a first conductive type. A first store transistor, and a second store transistor having a second conductive type opposite to the first conductive type, are disposed in the substrate, wherein a first gate of the first transistor and a second gate of the second transistor are coupled to each other. A select transistor having a second conductive type is disposed in the substrate. A first source region of the first transistor is coupled to a bit line. A second drain region of the second transistor and a select gate of the select transistor are coupled to a select gate line. A first drain region of the first transistor is coupled to a source region of the select transistor. A third drain region of the select transistor is coupled to a select line, so that a bit is stored in the first and second gates by controlling the bit line and the select gate line, or the bit stored in the first and second gates is erased by controlling the bit line and the select gate line. A second source region of the second store transistor is coupled to the bit line. Alternatively, the non-volatile memory cell further comprises a second well having the second conductive type disposed in the first well, wherein the second store transistor is disposed on the first well. A first voltage is applied to the bit line. A second voltage is applied to the select gate line, the select line and the substrate, wherein the first voltage is larger than 0V and the second voltage is 0V.

One exemplary embodiment of a method for reading a non-volatile memory cell, which is used to store a single bit data, comprises providing a non-volatile memory cell comprising a substrate having a first conductive type. A first store transistor, and a second store transistor having a second conductive type opposite to the first conductive type, are disposed in the substrate, wherein a first gate of the first transistor and a second gate of the second transistor are coupled to each other. A select transistor having a second conductive type is disposed in the substrate. A first source region of the first transistor is coupled to a bit line. A second drain region of the second transistor and a select gate of the select transistor are coupled to a select gate line. A first drain region of the first transistor is coupled to a source region of the select transistor. A third drain region of the select transistor is coupled to a select line, so that a bit is stored in the first and second gates by controlling the bit line and the select gate line, or the bit stored in the first and second gates is erased by controlling the bit line and the select gate line. A second source region of the second store transistor is electrically floating. Alternatively, the non-volatile memory cell further comprises a second well having the second conductive type disposed in the first well, wherein the second store transistor is disposed on the first well. A first voltage is applied to the bit line. A second voltage is applied to the select gate line. A third voltage is applied to the select line and the well region, wherein the second voltage is larger than the first voltage and the third voltage is 0V.

Another exemplary embodiment of a method for reading a non-volatile memory cell, which is used to store a single bit data, comprises providing a non-volatile memory cell comprising a substrate having a first conductive type. A first store transistor, and a second store transistor having a second conductive type opposite to the first conductive type, are disposed in the substrate, wherein a first gate of the first transistor and a second gate of the second transistor are coupled to each other. A select transistor having a second conductive type is disposed in the substrate. A first source region of the first transistor is coupled to a bit line. A second drain region of the second transistor and a select gate of the select transistor are coupled to a select gate line. A first drain region of the first transistor is coupled to a source region of the select transistor. A third drain region of the select transistor is coupled to a select line, so that a bit is stored in the first and second gates by controlling the bit line and the select gate line, or the bit stored in the first and second gates is erased by controlling the bit line and the select gate line. A second source region of the second store transistor is coupled to the bit line. Alternatively, the non-volatile memory cell further comprises a second well having the second conductive type disposed in the first well, wherein the second store transistor is disposed on the first well. A first voltage is applied to the bit line. A second voltage is applied to the select gate line, the select line and the substrate, wherein the first voltage is larger than 0V and the second voltage is 0V.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
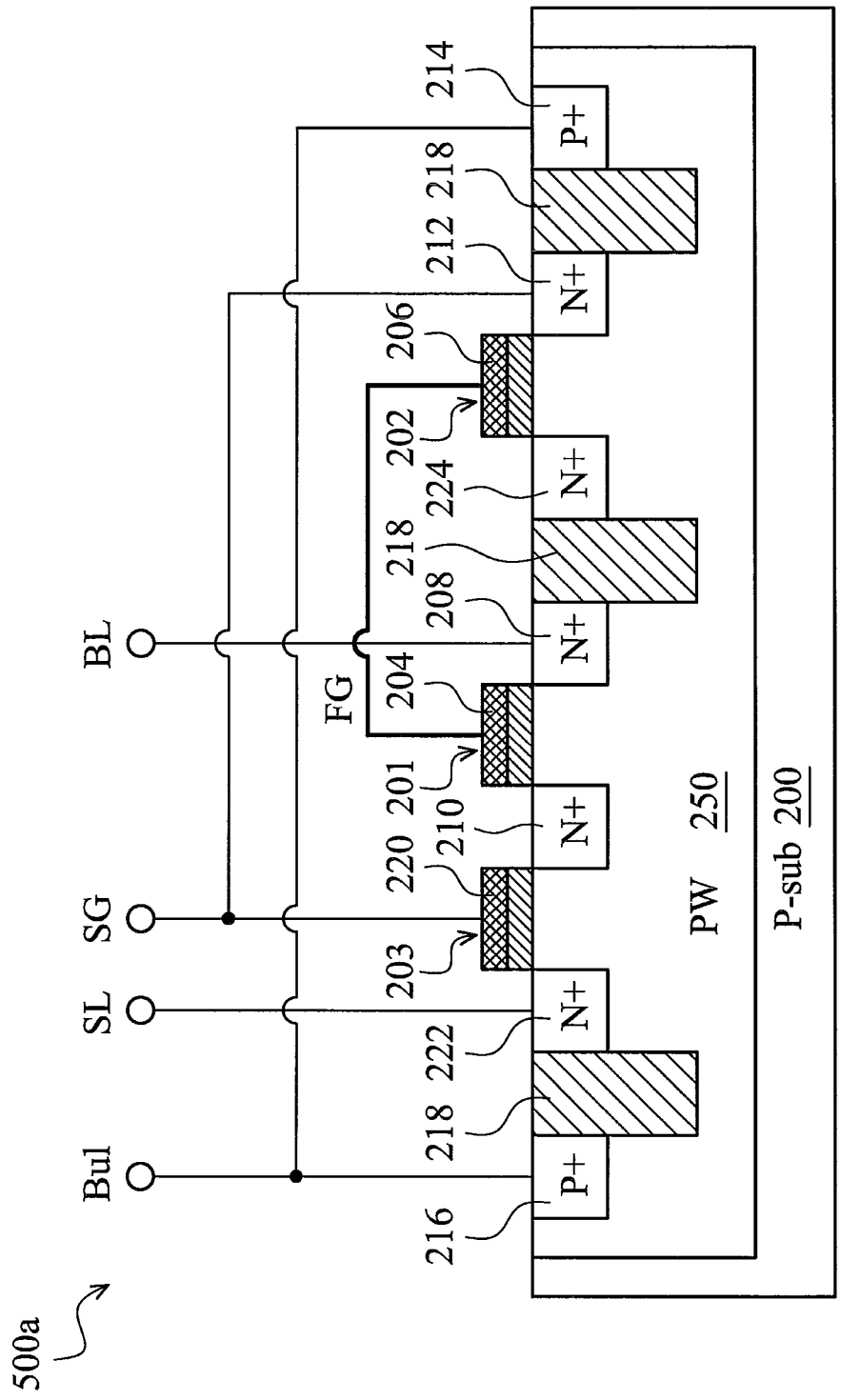
FIG. 1 is a cross section view showing one exemplary embodiment of a non-volatile memory cell of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 2:
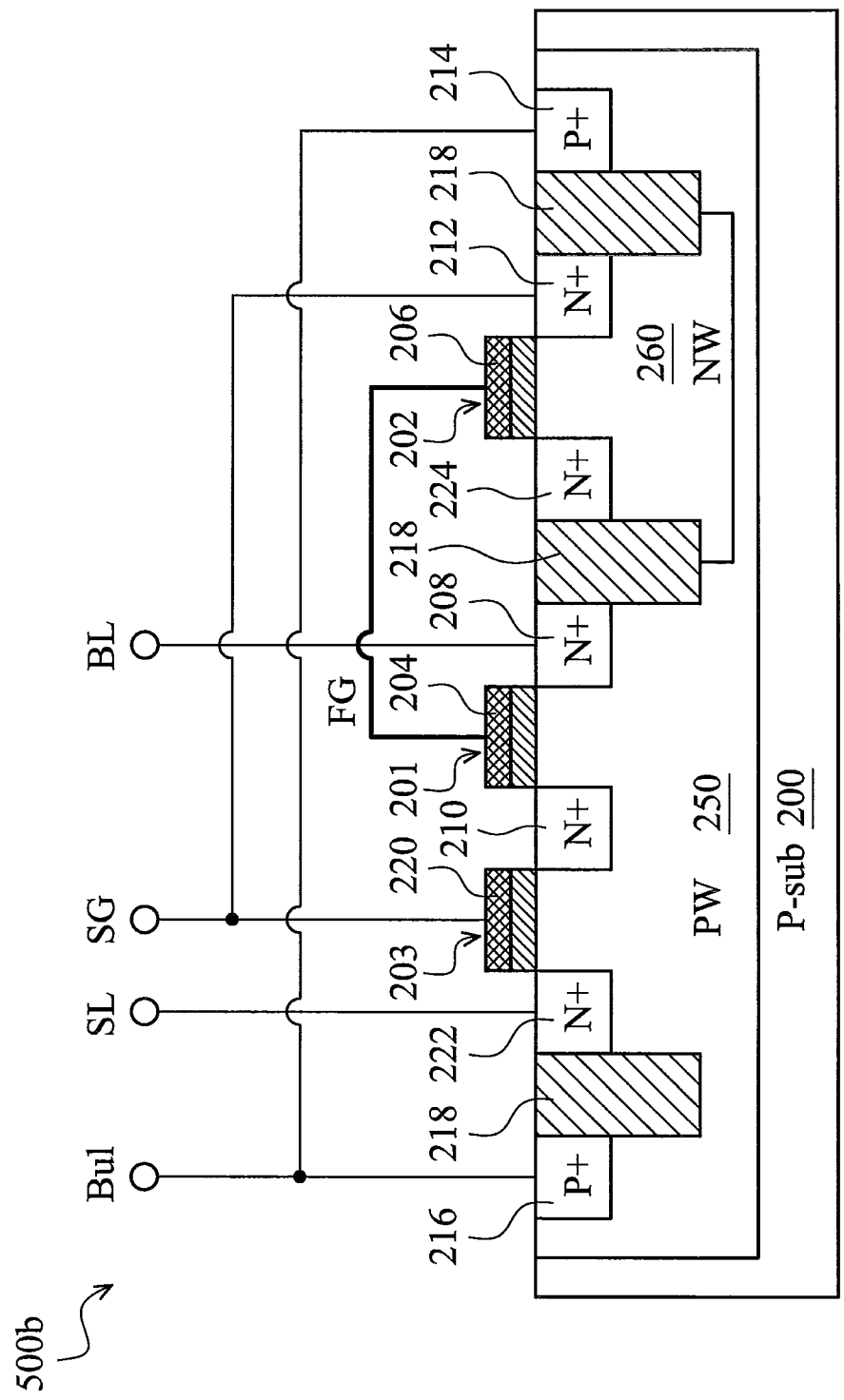
FIG. 2 is a cross section view showing another exemplary embodiment of a non-volatile memory cell of the invention.
Figure 3:
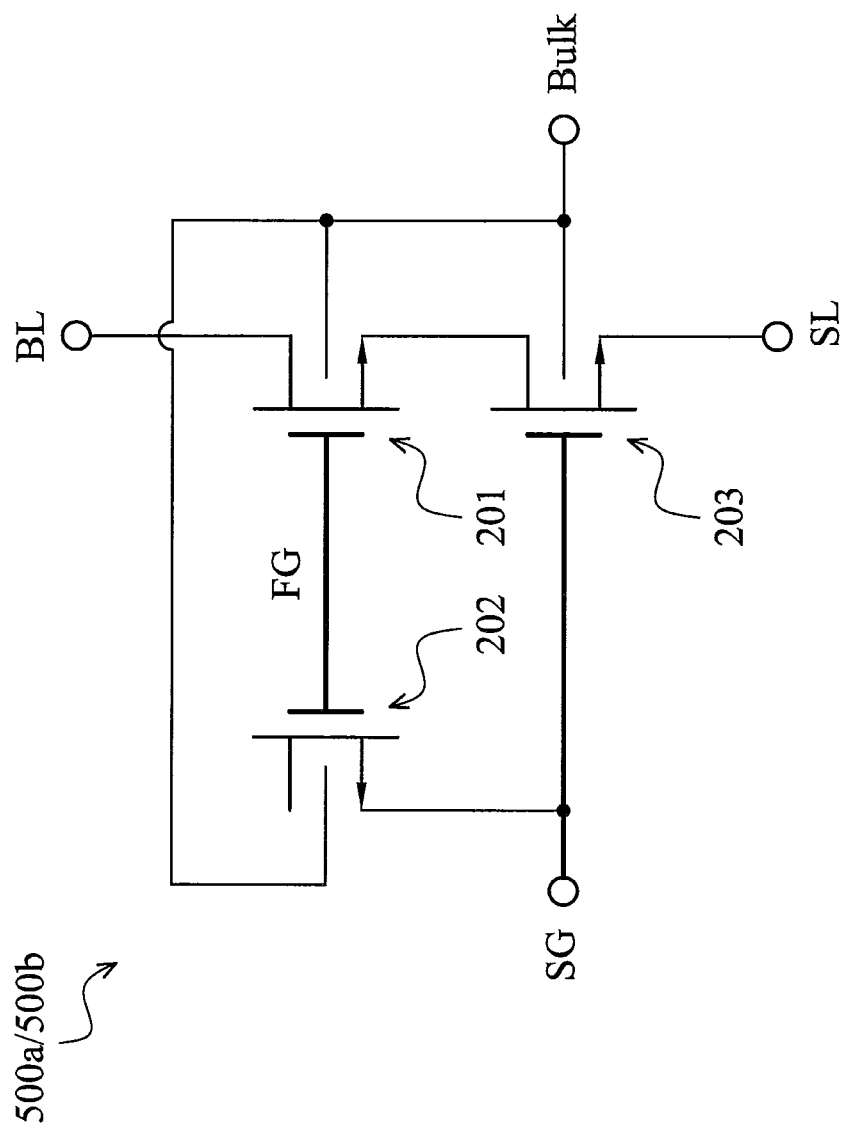
FIG. 3 is a circuit diagram showing exemplary embodiments of a non-volatile memory cell of the invention as shown in FIGS. 1 and 2.

FIGS. 1 and 2 are cross section views showing various exemplary embodiments of the non-volatile memory cells 500a and 500b of the invention, respectively. FIG. 3 is a circuit diagram showing exemplary embodiments of the non-volatile memory cells 500a and 500b of the invention as shown in FIGS. 1 and 2. One exemplary embodiment of the non-volatile memory cells 500a and 500b uses three transistors to compose a single gate electrically erasable programmable read-only memory (EEPROM) cell to store a single bit data. Please refer to FIGS. 1 and 3, wherein one exemplary embodiment of the non-volatile memory cells 500*a* may comprise a first well region 250 disposed in a substrate 200. The substrate 200 and the first well region 250 have a first conductive type. A first store transistor 201, a second store transistor 202 and a select transistor 203, which have a second conductive type opposite to the first conductive type, are disposed on the first well region 250, respectively. The first store transistor 201, a second store transistor 202 and a select transistor 203 are four-terminal transistors, respectively. The four-terminal transistor has a gate terminal, a source terminal, a drain terminal and a bulk terminal. In one embodiment, the first well region 250 is a p-well (PW) region. Also, the first store transistor 201, a second store transistor 202 and a select transistor 203 may be n-type metal-oxide-semiconductor (NMOS) transistors. A gate 204 of the first store transistor 201 and a gate 206 of the second store transistor 202 are coupled to each other. That is to say, a gate terminal of the first store transistor 201 is coupled to a gate terminal of the second store transistor 202 as shown in FIG. 3. In one embodiment, the gates 204 and 206 are single gate structures, and the gates 204 and 206 are electrically floating. Therefore, the coupled gates 204 and 206 may serve as a floating gate (FG) of the non-volatile memory cell 500*a*.

As shown in FIG. 1, the drain region 210 and the source region 208 are disposed adjacent to two opposite sides of the gate 204 of the first store transistor 201. Also, the source region 208 is coupled to a bit line BL as shown in FIG. 3, and the bit line BL may be coupled to a sense amplifier. The drain region 210 of the first store transistor 201 and a source region of the select transistor 203 are common in use. That is to say, a drain terminal of the first store transistor 201 is coupled to a source terminal of the second select transistor 203 as shown in FIG. 3. Therefore, as shown in FIG. 1, the drain region 222 and the source region (also referred to as the drain region 210) are disposed adjacent to two opposite sides of the gate 204 of the select transistor 203. Additionally, the drain region 222 of the select transistor 203 is coupled to a select line SL as shown in FIG. 3. As shown in FIG. 1, a drain region 212 of the second store transistor 202 and a select gate 220 of the select transistor 203 are both coupled to a select gate line SG. That is to say, a drain terminal of the second store transistor 202 is coupled to gate terminal of the select transistor 203. In one embodiment as shown in FIGS. 1 and 3, a source region 224 of the second store transistor 202 is electrically floating.

In one embodiment, the drain regions 210, 212 and 222 and the source regions 208 and 224 are n-type. A plurality of heavily doped n-type (N+) regions can be formed in the p-type first well region 250 to serve as the drain regions 210, 212 and 222 and the source regions 208 and 224. Additionally, a plurality of heavily doped p-type (P+) regions can be formed in the p-type first well region 250 to serve as bulk doped regions 214 and 216. The bulk doped regions 214 and 216 are respectively isolated from the adjacent drain regions 201 and 212 by isolation structures 218 formed in the first well region 250. Additionally, the first store transistor 201 is isolated from the adjacent second store transistor 202 by another isolation structure 218.

FIG. 2 is a cross section view showing another exemplary embodiment of a non-volatile memory cell 500*b* of the invention. The differences between the non-volatile memory cells 500*a* and 500*b* are that the non-volatile memory cell 500*b* further comprises a second well region 260, which has the second conductive type, disposed in the first well region 250. Also, the second store transistor 202 is disposed in a second well region 260. In one embodiment, the second well region 260 may serve as an n-type well. Because the source region 224 of the n-type second store transistor 202 of the non-volatile memory cell 500*a* is electrically floating, the second store transistor 202 has a gate-to-drain capacitance (Cgd) rather than a gate-to-channel capacitance (Cgc) during operation of the non-volatile memory cell 500*a* (i.e. when applying a voltage to the drain region 212 of the second store transistor 202). As shown in FIGS. 2 and 3, however, because the second store transistor 202 is disposed in an n-type well region (the second well region 260), the second store transistor 202 has a gate-to-drain capacitance (Cgd) and a gate-to-channel capacitance (Cgc) during operation of the non-volatile memory cell 500*b* (i.e. when applying a voltage to the drain region 212 of the second store transistor 202). Also, the gate-to-channel capacitance (Cgc) is a plane capacitor with a larger area. Therefore, an operation speed of the non-volatile memory cell 500*b* is faster than that of the non-volatile memory cell 500*a*.

Next, operation methods of one exemplary embodiment of the non-volatile memory cells 500*a*/500*b* of the invention will be described. Operation conditions of a single non-volatile memory cell 500*a*/500*b* or a memory array arranged by a plurality of non-volatile memory cells 500*a*/500*b* will be described in the following Tables 1 to 3. In the Tables 1 to 3, the state "select" means the operation conditions of the selected single non-volatile memory cell 500*a*/500*b* or the selected non-volatile memory cells 500*a*/500*b* of the memory array. The state "unselect" means the operation conditions of the non-volatile memory cells 500*a*/500*b* of the memory array, exclusive of the selected non-volatile memory cells 500*a*/500*b* of the memory array.

The operation method of one exemplary embodiment of the non-volatile memory cells 500*a*/500*b* comprises a programming operation, an erasing operation and a reading operation. The programming operation of one exemplary embodiment of the non-volatile memory cells 500*a*/500*b* uses channel hot electron (CHE) injection or drain-avalanche hot-carrier (DAHC) injection to inject electrons into the floating gate (FG).

TABLE 1 the programming operation of one exemplary embodiment
of the non-volatile memory cells 500a/500b

| | VBL | | VSG | | | |
|---|---|---|---|---|---|---|
| | select | unselect | select | unselect | VSL | VBulk |
| CHE | <HV | 0 V | HV | 0 V | 0 V | 0 V |
| DAHC | HV | 0 V | HV | 0 V | 0 V | 0 V |

As shown in Table 1, the programming operation of the selected non-volatile memory cell 500*a*/500*b* using channel hot electron (CHE) injection comprises applying a voltage VBulk of 0V to bulk terminals of the first store transistor 201 and the second store transistor 202 (i.e. the bulk doped regions 214 and 216 of the first well region 250 such as a p-type well region as shown in FIGS. 1 and 2). The select line SL (i.e. the n-type drain region 222 such as an N+ doped region as shown in FIGS. 1 and 2) is applied a voltage VSL of 0V. The bit line BL (i.e. the n-type source region 208 such as an N+ doped region as shown in FIGS. 1 and 2) is applied a voltage VBL of a proper value (<HV). Therefore, a reverse biased pn junction is formed between the n-type source region 208 and the p-type first well region 250. Further, the select gate line SG (i.e. the select gate 220 of the select transistor 203 and the n-type drain region 212 such as an N+ doped region as shown in FIGS. 1 and 2) is applied a voltage VSG of a high enough voltage of HV. Also, the voltage VSG of HV is coupled to the floating gate (FG) (i.e. the gate 204 and 206 as shown in FIGS. 1 and 2) through the drain region 212, so that a channel of the select transistor 203 is slightly turned on when a channel of the first store transistor 201 is turned on. Therefore, the channel hot electrons (CHE) passing through the channel of the first store transistor 201 are accelerated for injection into the floating gate (FG). A bit is stored in the floating gate (FG), completing the programming operation of the selected non-volatile memory cell 500a/500b. In one embodiment of programming the selected non-volatile memory cell 500a/500b using channel hot electron (CHE) injection, the voltage VBL may be smaller than the voltage VSG, and the voltage VSG may be larger than 0V and smaller than the breakdown voltage of the n-type drain region 212 to the p-type first well region 250.

As shown in Table 1, the programming operation of the selected non-volatile memory cell 500a/500b using drain-avalanche hot-carrier (DAHC) injection comprises applying a voltage VBulk of 0V to bulk terminals of the first store transistor 201 and the second store transistor 202 (i.e. the bulk doped regions 214 and 216 of the first well region 250 such as a p-type well region as shown in FIGS. 1 and 2). The select line SL (i.e. the n-type drain region 222 such as an N+ doped region as shown in FIGS. 1 and 2) is applied a voltage VSL of 0V. The bit line BL (i.e. the n-type source region 208 such as an N+ doped region as shown in FIGS. 1 and 2) is applied a voltage VBL of a high enough voltage of HV. Therefore, a reverse biased pn junction is formed between the n-type source region 208 and the p-type first well region 250. Further, the select gate line SG (i.e. the select gate 220 of the select transistor 203 and the n-type drain region 212 such as an N+ doped region as shown in FIGS. 1 and 2) is applied a voltage VSG of a high enough voltage of HV. Also, the voltage VSG of HV is coupled to the floating gate (FG) (i.e. the gate 204 and 206 as shown in FIGS. 1 and 2) through the drain region 212, so that a channel of the select transistor 203 is slightly turned on when a channel of the first store transistor 201 is turned on. Therefore, the drain-avalanche hot-electrons passing through the channel of the first store transistor 201 are accelerated for injection into the floating gate (FG). A bit is stored in the floating gate (FG), completing the programming operation of the selected non-volatile memory cell 500a/500b. In one embodiment of programming the selected non-volatile memory cell 500a/500b using drain-avalanche hot-carrier (DAHC) injection, the voltages VBL and VSG may be smaller than the breakdown voltage of the n-type drain region 212 and n-type source region 208 to the p-type first well region 250, respectively. Because the non-volatile memory cell 500a/500b has a select transistor 203, the unselected non-volatile memory cell may be completely turned-off without leakage current.

The erasing operation of one exemplary embodiment of the non-volatile memory cells 500a/500b uses band-to-band hot hole (BBHH) injection to inject hot holes into the floating gate.

TABLE 2 the erasing operation of one exemplary embodiment of the non-volatile memory cells 500a/500b

| | VBL | | VSG | | | |
| --- | --- | --- | --- | --- | --- | --- |
| | select | unselect | select | unselect | VSL | VBulk |
| applied voltage | HV | 0 V | >Vtn | 0 V | 0 V | 0 V |

As shown in Table 2, the erasing operation of the selected non-volatile memory cell 500a/500b comprises applying a voltage VBulk of 0V to bulk terminals of the first store transistor 201 and the second store transistor 202 (i.e. the bulk doped regions 214 and 216 of the first well region 250 such as a p-type well region as shown in FIGS. 1 and 2). The select line SL (i.e. the n-type drain region 222 such as an N+ doped region as shown in FIGS. 1 and 2) is applied a voltage VSL of 0V. The bit line BL (i.e. the n-type source region 208 such as an N+ doped region as shown in FIGS. 1 and 2) is applied a voltage VBL of a high enough voltage of HV. Therefore, a reverse biased pn junction is formed between the n-type source region 208 and the p-type first well region 250. Further, the select gate line SG (i.e. the select gate 220 of the select transistor 203 and the n-type drain region 212 such as an N+ doped region as shown in FIGS. 1 and 2) is applied a voltage VSG larger than the threshold voltage (>Vtn) of the select transistor 203 to turn on channels of the first store transistor 201 and the second store transistor 202. Also, the voltage VBL may increase the probability of hole fluctuation. Therefore, the hot holes (HH) generated by the band-to-band hot hole (BBHH) are injected into the floating gate (FG) to erase the stored bit in the floating gate (FG), completing the erasing operation of the selected non-volatile memory cell 500a/500b. In one embodiment, the voltage VBL may be larger than 0V and smaller than the breakdown voltage of the n-type source region 208 to the p-type first well region 250. The voltage VSG is larger than the threshold voltage (Vtn) of the select transistor 203.

The reading operation of one exemplary embodiment of the non-volatile memory cells 500a/500b is achieved by applying a voltage larger than the threshold voltage (Vtn) of the select transistor 203 to the select gate line SG and applying a small voltage to the bit line BL to measure currents flowing through the bit line BL.

TABLE 3 the reading operation of one exemplary embodiment of the non-volatile memory cells 500a/500b

| | VBL | | VSG | | | |
| --- | --- | --- | --- | --- | --- | --- |
| | select | unselect | select | unselect | VSL | VBulk |
| applied voltage | >0 V | 0 V | >Vtn | 0 V | 0 V | 0 V |

As shown in Table 3, the reading operation of the selected non-volatile memory cell 500a/500b comprises applying a voltage VBulk of 0V to bulk terminals of the first store transistor 201 and the second store transistor 202 (i.e. the bulk doped regions 214 and 216 of the first well region 250 such as a p-type well region as shown in FIGS. 1 and 2). The bit line BL (i.e. the n-type source region 208 such as an N+ doped region as shown in FIGS. 1 and 2) is applied a voltage VBL larger than 0V, for example, between about 1V and 2V. The select line SL (i.e. the n-type drain region 222 such as an N+ doped region as shown in FIGS. 1 and 2) is applied a voltage VSL of 0V. Therefore, a reverse biased pn junction is formed between the n-type source region 208 and the p-type first well region 250. Further, the select gate line SG (i.e. the select gate 220 of the select transistor 203 and the n-type drain region 212 such as an N+ doped region as shown in FIGS. 1 and 2) is applied a voltage VSG larger than the threshold voltage (>Vtn) of the select transistor 203 to turn on channels of the first store transistor 201 and the second store transistor 202. A sense amplifier coupled to the bit line BL is used to measure the currents flowing through the bit line BL, completing the reading operation of the selected non-volatile memory cell 500a/500b. The voltage VSL used to read the selected non-volatile memory cell 500 may be slightly larger than the threshold voltages of the first second transistor 201 and the select transistor 203 to turn on the first second transistor 201 and the select transistor 203.

One exemplary embodiment of the non-volatile memory cells 500a/500b of the invention uses three n-type MOS (NMOS) transistors disposed on a p-type well region to serve as a single gate non-volatile memory cell to store a single bit data therein. The gates of the two n-type store NMOS transistors, which are coupled to each other, may serve as a floating gate (FG). A drain terminal of one of the n-type store MOS transistors is coupled to a source terminal of an n-type select MOS transistor in series, and the source terminal of an n-type select MOS transistor is coupled to a bit line (BL). A drain terminal of another one of the n-type store MOS transistors is coupled to a select gate (SG) of the n-type select MOS transistor, and a source terminal of another one of the n-type store MOS transistors is electrically floating. Additionally, a drain terminal of the n-type select MOS transistor is coupled to a select line (SL). Therefore, a bit can be stored in the floating gate (FG) by controlling the bit line (BL) and the select line (SL) (i.e. when applying voltages to the bit line (BL) and the select line (SL), respectively), and the bit stored in the floating gate (FG) can be erased by controlling the bit line (BL) and the select line (SL).

Compared with the conventional single gate non-volatile memory cell, the unselected non-volatile memory cell of the non-volatile memory cell 500a/500b may be completely turned-off without leakage current due to a select transistor 203 of the non-volatile memory cell 500a/500b. Therefore, the non-volatile memory cell 500a/500b has improved endurance and less read-write disturbance. Additionally, the non-volatile memory cell 500a/500b is formed on a p-type well (PW) and/or an n-type well (NW), and only a standard logic process is used to fabricate the non-volatile memory cell 500a/500b without additional mask processes to form additional wells, which are harmful for product yield. Further, the non-volatile memory cell 500a/500b operates with a positive voltage range but not a negative voltage range. Therefore, the non-volatile memory cell 500a/500b has a simple circuit design.

Figure 4:
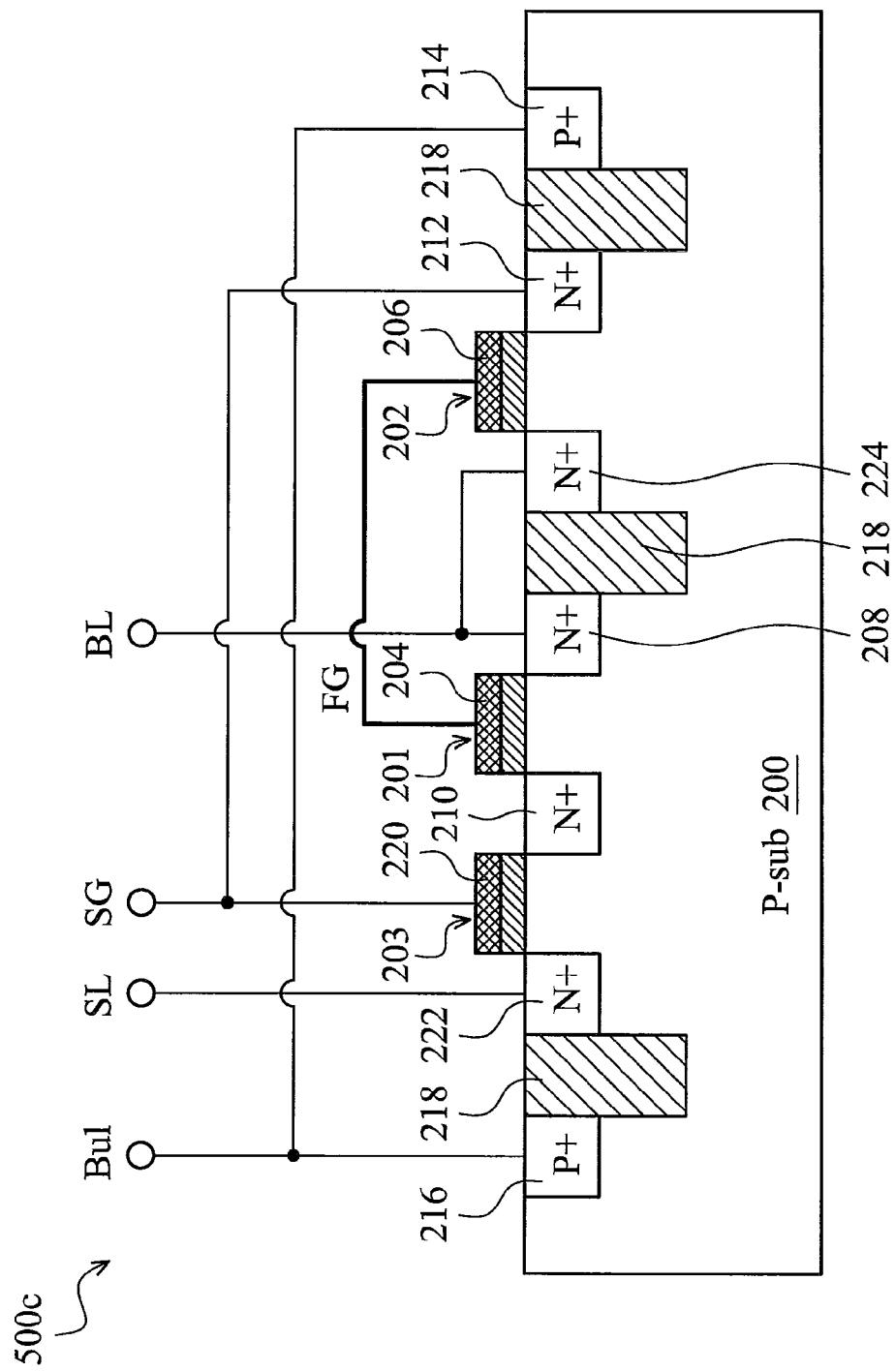
FIG. 4 is a cross section view showing yet another exemplary embodiment of a non-volatile memory cell of the invention.
Figure 5:
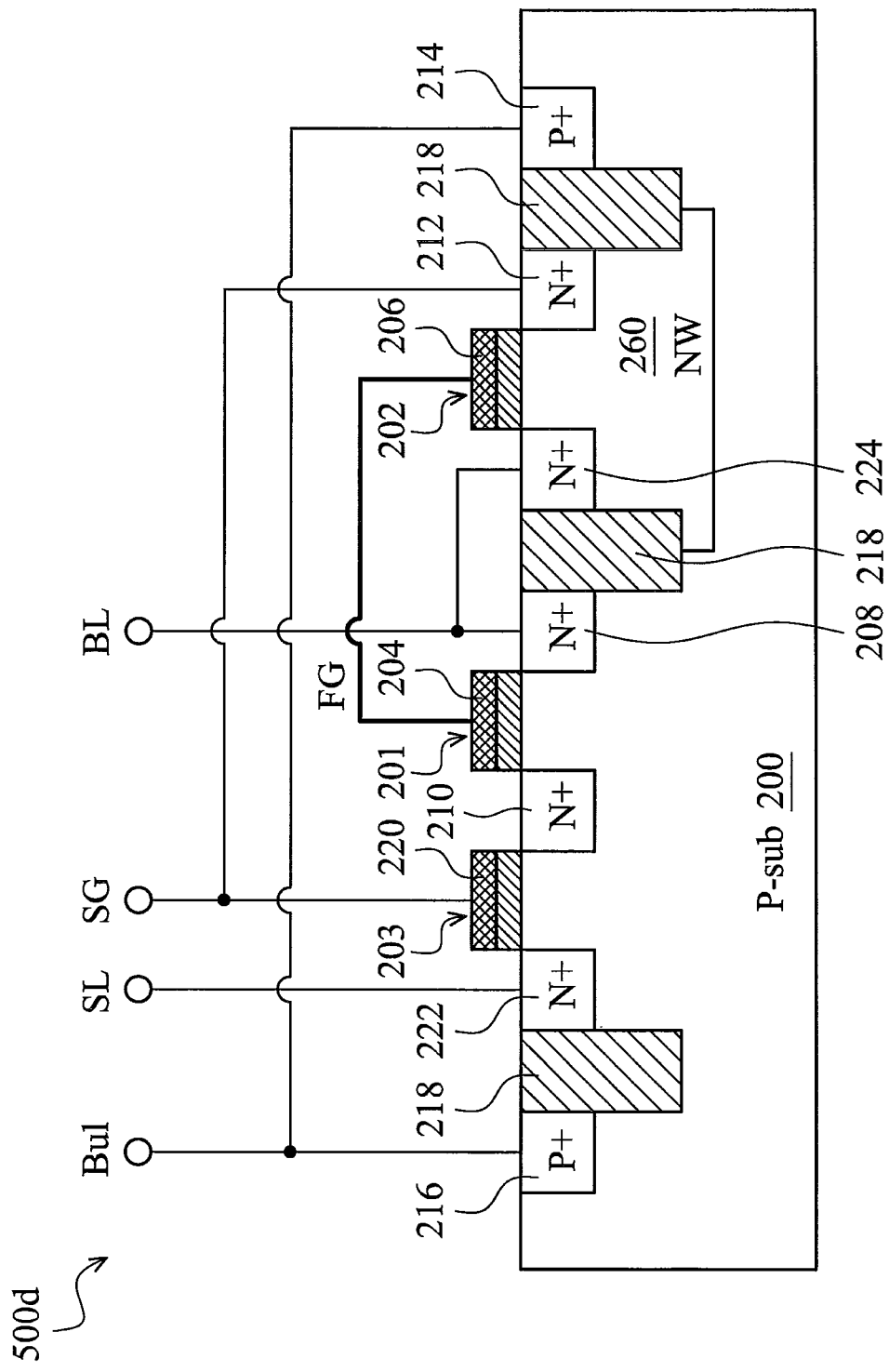
FIG. 5 is a cross section view showing still yet another exemplary embodiment of a non-volatile memory cell of the invention.
Figure 6:
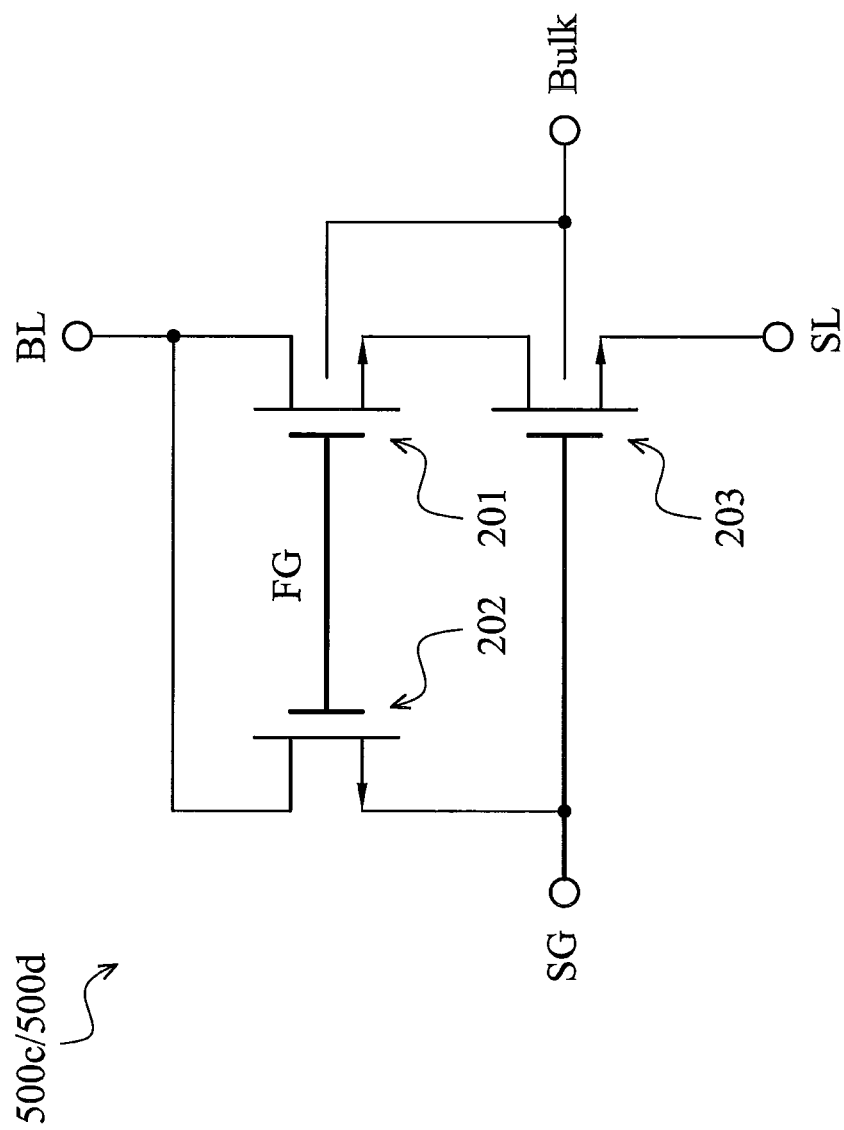
FIG. 6 is a circuit diagram showing exemplary embodiments of a non-volatile memory cell of the invention as shown in FIGS. 4 and 5.

FIGS. 4 and 5 are cross section views showing various exemplary embodiments of a non-volatile memory cell 500c and 500d of the invention. FIG. 6 is a circuit diagram showing exemplary embodiments of a non-volatile memory cell 500c and 500d of the invention as shown in FIGS. 4 and 5. The non-volatile memory cells 500c and 500d of the invention use three n-type MOS (NMOS) transistors as a single gate electrically erasable programmable read-only memory (EEPROM) cell to store a single bit data therein. Elements of the embodiments hereinafter, that are the same or similar as those previously described with reference to FIGS. 1-3, are not repeated for brevity. A source region 224 of a second store transistor 202 of the non-volatile memory cell 500c/500d is coupled to a bit line (BL). Therefore, as shown in FIGS. 4 and 6, the second store transistor 202 has a gate-to-drain capacitance (Cgd) and a gate-to-source capacitance (Cgs) rather than a gate-to-channel capacitance (Cgc) during operation of the non-volatile memory cell 500c (i.e. when applying a voltage to a drain region 212 and the source region 224 of the second store transistor 202). As shown in FIGS. 5 and 6, however, because the second store transistor 202 of the non-volatile memory cell 500d is disposed in an n-type well region (the second well region 260), the second store transistor 202 has a gate-to-drain capacitance (Cgd), a gate-to-source capacitance (Cgs) and a gate-to-channel capacitance (Cgc) during operation of the non-volatile memory cell 500d (i.e. when applying a voltage to the drain region 212 of the second store transistor 202). Also, the gate-to-channel capacitance (Cgc) is a plane capacitor with a larger area. Therefore, an operation speed of the non-volatile memory cell 500d is faster than that of the non-volatile memory cell 500c.

Next, operation methods of one exemplary embodiment of a non-volatile memory cell 500c/500d of the invention will be described. Operation conditions of a single non-volatile memory cell 500c/500d or a memory array arranged by a plurality of non-volatile memory cells 500c/500d will be described in the following Tables 4 to 6. In the Tables 4 to 6, the state "select" means the operation conditions of the selected single non-volatile memory cell 500c/500d or the selected non-volatile memory cells 500c/500d of the memory array. The state "unselect" means the operation conditions of the non-volatile memory cells 500c/500d of the memory array, exclusive of the selected non-volatile memory cells 500c/500d of the memory array.

The operation method of one exemplary embodiment of a non-volatile memory cell 500c/500d comprises a programming operation, an erasing operation and a reading operation. The programming operation of one exemplary embodiment of a non-volatile memory cell 500c/500d uses channel hot electron (CHE) injection to inject electrons into the floating gate (FG).

TABLE 4 the programming operation of one exemplary embodiment of a non-volatile memory cell 500c/500d

|  | VBL | | VSG | | VSL | | |
| --- | --- | --- | --- | --- | --- | --- | --- |
|  | select | unselect | select | unselect | select | unselect | VBulk |
| applied voltage | HV | floating | 0 V | floating | 0 V | floating | 0 V |

As shown in Table 4, the programming operation of the selected non-volatile memory cell 500c/500d using channel hot electron (CHE) injection comprises applying a voltage VBulk of 0V to bulk terminals of the first store transistor 201 and the second store transistor 202 (i.e. the bulk doped regions 214 and 216 of the substrate 200 such as a p-type substrate as shown in FIGS. 4 and 5). The select line SL (i.e. the n-type drain region 222 such as an N+ doped region as shown in FIGS. 4 and 5) is applied a voltage VSL of 0V. The bit line BL (i.e. the n-type source regions 208, 224 such as N+ doped regions as shown in FIGS. 4 and 5) is applied a voltage VBL of a high enough value of HV. Therefore, a reverse biased pn junction is formed between the n-type source regions 208, 224 (or the n-type well region 260) and the p-type substrate 200. Also, the voltage VBL of HV is coupled to the floating gate (FG) (i.e. the gate 204 and 206 as shown in FIGS. 4 and 5) through the n-type source regions 208, 224, so that a channel of the second store transistor 202 is slightly opened. Further, the select gate line SG (i.e. the select gate 220 of the select transistor 203 and the n-type drain region 212 such as an N+ doped region as shown in FIGS. 4 and 5) is applied a voltage VSG of 0V (i.e. the select transistor 203 does not turn on). Therefore, the channel hot electrons (CHE) passing through the channel of the second store transistor 202 are accelerated for injection into the floating gate (FG). A bit is stored in the floating gate (FG), completing the programming operation of the selected non-volatile memory cell 500c/500d. In one embodiment of programming the selected non-volatile memory cell 500c/500d using channel hot electron (CHE) injection, the voltage VBL may be smaller than the breakdown voltages of the n-type source regions 208, 224 (or the n-type well region 260) to the p-type substrate 200. The bit line BL, the select gate line SG and the select line SL of the unselected non-volatile memory cell 500c/500d are electrically floating (shown as "floating" in the Table).

The erasing operation of one exemplary embodiment of a non-volatile memory cell 500c/500d uses band-to-band hot hole (BBHH) injection to inject hot holes into the floating gate.

TABLE 5 the erasing operation of one exemplary embodiment of a non-volatile memory cell 500c/500d

| | VBL | | VSG | | VSL | | |
|---|---|---|---|---|---|---|---|
| | select | unselect | select | unselect | select | unselect | VBulk |
| applied voltage | 0 V | floating | HV | floating | 0 V | floating | 0 V |

As shown in Table 5, the erasing operation of the selected non-volatile memory cell 500c/500d comprises applying a voltage VBulk of 0V to bulk terminals of the first store transistor 201 and the second store transistor 202 (i.e. the bulk doped regions 214 and 216 of the substrate 200 such as a p-type substrate as shown in FIGS. 4 and 5). The select line SL (i.e. the n-type drain region 222 such as an N+ doped region as shown in FIGS. 4 and 5) is applied a voltage VSL of 0V. The bit line BL (i.e. the n-type source regions 208, 224 such as N+ doped regions as shown in FIGS. 4 and 5) is applied a voltage VBL of 0V. Further, the select gate line SG (i.e. the select gate 220 of the select transistor 203 and the n-type drain region 212 such as an N+ doped region as shown in FIGS. 4 and 5) is applied a voltage VSG an enough high voltage of HV. Therefore, a reverse biased pn junction is formed between the n-type drain region 212 and the p-type substrate 200. Also, the voltage VSG may increase the probability of hole fluctuation in the n-type drain region 212. Therefore, the hot holes (HH) generated by the band-to-band hot hole (BBHH) are injected into the floating gate (FG) to erase the stored bit in the floating gate (FG), completing the erasing operation of the selected non-volatile memory cell 500c/500d. In one embodiment, the voltage VSG may be larger than 0V and smaller than the breakdown voltage of the n-type drain region 212 (or the n-type well region 260) to the p-type substrate 200. The bit line BL, the select gate line SG and the select line SL of the unselected non-volatile memory cell 500c/500d are electrically floating (shown as "floating" in the Table).

The reading operation of one exemplary embodiment of a non-volatile memory cell 500c/500d is achieved by applying a voltage of 0V to the select gate line SG and applying a small voltage to the bit line BL to measure currents flowing through the bit line BL.

TABLE 6 the reading operation of one exemplary embodiment of a non-volatile memory cell 500c/500d

| | VBL | | VSG | | | |
|---|---|---|---|---|---|---|
| | select | unselect | select | unselect | VSL | VBulk |
| applied voltage | >0 V | 0 V | 0 V | 0 V | 0 V | 0 V |

As shown in Table 6, the reading operation of the selected non-volatile memory cell 500c/500d comprises applying a voltage VBulk of 0V to bulk terminals of the first store transistor 201 and the second store transistor 202 (i.e. the bulk doped regions 214 and 216 of the substrate 200 such as a p-type substrate as shown in FIGS. 4 and 5). The select line SL (i.e. the n-type drain region 222 such as an N+ doped region as shown in FIGS. 4 and 5) is applied a voltage VSL of 0V. The bit line BL (i.e. the n-type source regions 208, 224 such as N+ doped regions as shown in FIGS. 4 and 5) is applied a voltage VBL larger than 0V. Further, the select gate line SG (i.e. the select gate 220 of the select transistor 203 and the n-type drain region 212 such as an N+ doped region as shown in FIGS. 4 and 5) is applied a voltage VSG of 0V (i.e. the select transistor 203 does not turn on). Therefore, a channel of the second store transistor 202 is opened. A sense amplifier coupled to the bit line BL is used to measure the currents flowing through the bit line BL, completing the reading operation of the selected non-volatile memory cell 500c/500d. In one embodiment, the voltage VBL is between about 1V and 2V.

Compared with the conventional single gate non-volatile memory cell, the source and drain region of the non-volatile memory cell of the non-volatile memory cell 500c/500d are respectively coupled to a bit line (BL) and a select gate line (SG). Therefore, the second store transistor 202 has a gate-to-drain capacitance (Cgd) and a gate-to-source capacitance (Cgs) or further has a gate-to-channel capacitance (Cgc) during operation of the non-volatile memory cell 500c/500d (i.e. when applying a voltage to a drain region 212 and the source region 224 of the second store transistor 202). Therefore, the non-volatile memory cell 500c/500d has a faster operation speed than the conventional single gate non-volatile memory cell. Additionally, the non-volatile memory cell 500c/500d is formed on a p-type well (PW) and/or an n-type well (NW), and only a standard logic process is used to fabricate the non-volatile memory cell 500c/500d without additional mask processes to form additional wells, which are harmful for product yield. Further, the non-volatile memory cell 500c/500d operates with a positive voltage range but not a negative voltage range. Therefore, the non-volatile memory cell 500c/500d has a simple circuit design.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory cell, which is used to store a single bit data, comprising:
   a substrate having a first conductive type;
   a first store transistor and a second store transistor disposed in the substrate, wherein a first gate of the first transistor and a second gate of the second transistor are coupled to each other, wherein the first transistor and the second transistor both have a second conductive type opposite to the first conductive type; and a select transistor having a second conductive type disposed in the substrate, wherein a first source region of the first transistor is coupled to a bit line, wherein a second drain region of the second transistor and a select gate of the select transistor are coupled to a select gate line, wherein a first drain region of the first transistor is coupled to a source region of the select transistor, and wherein a third drain region of the select transistor is coupled to a select line, so that a bit is stored in the first and second gates by controlling the bit line and the select gate line, or the bit stored in the first and second gates is erased by controlling the bit line and the select gate line.

2. The non-volatile memory cell as claimed in claim 1, wherein the first conductive type is p type, and the second conductive type is n type.

3. The non-volatile memory cell as claimed in claim 1, wherein the first gate, the second gate and the select gate are single gates.

4. The non-volatile memory cell as claimed in claim 1, wherein the bit line is coupled to a sense amplifier.

5. The non-volatile memory cell as claimed in claim 1, wherein the first gate and the second gate are electrically floating.

6. The non-volatile memory cell as claimed in claim 1, further comprising a first well having the first conductive type disposed in the substrate, wherein the first store transistor, the second store transistor and the select transistor are disposed on the first well.

7. The non-volatile memory cell as claimed in claim 6, wherein a second source region of the second store transistor is electrically floating.

8. The non-volatile memory cell as claimed in claim 7, further comprising a second well having the second conductive type disposed in the first well, wherein the second store transistor is disposed on the first well.

9. The non-volatile memory cell as claimed in claim 1, wherein a second source region of the second store transistor is coupled to the bit line.

10. The non-volatile memory cell as claimed in claim 9, further comprising a second well having the second conductive type disposed in the first well, wherein the second store transistor is disposed on the first well.

11. A method for programming a non-volatile memory cell, which is used to store a single bit data, comprising:
   providing the non-volatile memory cell as claimed in claim 7 or 8;
   applying a first voltage to the bit line;
   applying a second voltage to the select gate line; and
   applying a third voltage to the select line and the well region, wherein the first voltage is smaller than or equal to the second voltage, and the third voltage is 0V.

12. The method for programming a non-volatile memory cell as claimed in claim 11, wherein the first and second voltages are respectively larger than 0V and smaller than the breakdown voltages of the first and second drain regions.

13. A method for programming a non-volatile memory cell, which is used to store a single bit data, comprising:
   providing the non-volatile memory cell as claimed in claim 9 or 10;
   applying a first voltage to the bit line; and
   applying a second voltage to the select gate line, the select line and the substrate, wherein the first voltage is larger than 0V, and the second voltage is 0V.

14. The method for programming a non-volatile memory cell as claimed in claim 13, wherein the first voltages is smaller than the breakdown voltages of the first and second drain regions.

15. A method for erasing a non-volatile memory cell, which is used to store a single bit data, comprising:
   providing the non-volatile memory cell as claimed in claim 7 or 8;
   applying a first voltage to the bit line;
   applying a second voltage to the select gate line; and
   applying a third voltage to the select line and the well region, wherein the first voltage is larger than the second voltage, and the third voltage is 0V.

16. The method for erasing a non-volatile memory cell as claimed in claim 15, wherein the first voltage is larger than 0V and smaller than a breakdown voltage of the first drain region, and the second voltage is larger than the threshold voltages of the first and second store transistors.

17. A method for erasing a non-volatile memory cell, which is used to store a single bit data, comprising:
   providing the non-volatile memory cell as claimed in claim 9 or 10;
   applying a first voltage to the bit line; and
   applying a second voltage to the select gate line, the select line and the substrate, wherein the first voltage is larger than 0V, and the second voltage is 0V.

18. The method for erasing a non-volatile memory cell as claimed in claim 17, wherein the first voltage is smaller than a breakdown voltage of the third source region.

19. A method for reading a non-volatile memory cell, which is used to store a single bit data, comprising:
   providing the non-volatile memory cell as claimed in claim 7 or 8;
   applying a first voltage to the bit line;
   applying a second voltage to the select gate line; and
   applying a third voltage to the select line and the well region, wherein the second voltage is larger than the first voltage, and the third voltage is 0V.

20. The method for reading a non-volatile memory cell as claimed in claim 19, wherein the second voltage is larger than the threshold voltages of the first and second store transistors, and the first voltage is between about 1V and 2V.

21. A method for reading a non-volatile memory cell, which is used to store a single bit data, comprising:
   providing the non-volatile memory cell as claimed in claim 9 or 10;
   applying a first voltage to the bit line; and
   applying a second voltage to the select gate line, the select line and the substrate, wherein the first voltage is larger than 0V, and the second voltage is 0V.

22. The method for reading a non-volatile memory cell as claimed in claim 19, wherein the second voltage is larger than the threshold voltages of the first and second store transistors, and the first voltage is between about 1V and 2V.

* * * * *